(12) United States Patent
Aquilino et al.

(10) Patent No.: US 8,859,388 B2
(45) Date of Patent: Oct. 14, 2014

(54) SEALED SHALLOW TRENCH ISOLATION REGION

(75) Inventors: Michael V. Aquilino, Wappingers Falls, NY (US); Xiang Hu, Clifton Park, NY (US); Daniel J. Jaeger, Wappingers Falls, NY (US); Byeong Y. Kim, Lagrangeville, NY (US); Yong M. Lee, Singapore (SG); Ying Li, Ridgefield, CT (US); Reinaldo A. Vega, Wappingers Falls, NY (US)

(73) Assignees: International Business Machines Corporation, Armonk, NY (US); GLOBALFOUNDRIES Inc. (KY)

( * ) Notice: Subject to any disclaimer, the term of this patent is extended or adjusted under 35 U.S.C. 154(b) by 188 days.

(21) Appl. No.: 13/548,237

(22) Filed: Jul. 13, 2012

(65) Prior Publication Data

US 2014/0015092 A1     Jan. 16, 2014

(51) Int. Cl.
*H01L 29/06*     (2006.01)
*H01L 29/66*     (2006.01)
*H01L 21/8234*   (2006.01)

(52) U.S. Cl.
CPC .. *H01L 21/823437* (2013.01); *H01L 29/66621* (2013.01)
USPC ......................................................... 438/424

(58) Field of Classification Search
CPC ................. H01L 21/823437; H01L 29/66621
USPC ................................... 257/E21.546; 438/424
See application file for complete search history.

(56) References Cited

U.S. PATENT DOCUMENTS

| | | | |
|---|---|---|---|
| 5,817,567 A | 10/1998 | Jang et al. | |
| 6,146,970 A | 11/2000 | Witek et al. | |
| 6,171,929 B1 | 1/2001 | Yang et al. | |
| 6,228,741 B1 | 5/2001 | Walsh et al. | |
| 6,297,126 B1 | 10/2001 | Lim et al. | |
| 6,350,661 B2 | 2/2002 | Lim et al. | |
| 8,030,173 B2 | 10/2011 | Turner et al. | |
| 2005/0001252 A1* | 1/2005 | Kim et al. | 257/296 |
| 2011/0081765 A1* | 4/2011 | Cummings et al. | 438/424 |

* cited by examiner

*Primary Examiner* — Thomas L Dickey
(74) *Attorney, Agent, or Firm* — Cantor Colburn LLP; Yuanmin Cai

(57) ABSTRACT

A method for formation of a sealed shallow trench isolation (STI) region for a semiconductor device includes forming a STI region in a substrate, the STI region comprising a STI fill; forming a sealing recess in the STI fill of the STI region; and forming a sealing layer in the sealing recess over the STI fill.

13 Claims, 20 Drawing Sheets

US 8,859,388 B2

SEALED SHALLOW TRENCH ISOLATION REGION

BACKGROUND

This disclosure relates generally to the field of semiconductor device fabrication, and more particularly to a sealed shallow trench isolation (STI) region for a semiconductor device.

Integrated circuits (ICs) may include a large number of devices, such as complementary metal oxide semiconductor (CMOS) field effect transistors (FETs), formed on a chip. Production of smaller, higher performance devices is important to enhance performance and improve reliability of ICs. As devices are scaled down, the technology required to produce such devices becomes more complex. Various regions in a FET, such as source/drain regions, may be formed by epitaxial deposition to provide a relatively high performance device. Epitaxy refers to the deposition of a crystalline overlayer on a crystalline substrate, where the overlayer is in registry with the substrate. The overlayer is called an epitaxial film or epitaxial layer. It is desired that the deposited material form a crystalline overlayer that has one well-defined orientation with respect to the substrate crystal structure. Epitaxial films may be grown from gaseous or liquid precursors, and may comprise materials such as embedded silicon germanium (eSiGe).

Epitaxial deposition may require formation of a recess, in which the material is subsequently deposited, in the substrate. The recess may be formed by reactive ion etching (RIE). Additionally, there may be a precleaning step before deposition. The precleaning step may comprise using hydrofluoric (HF) acid. The formation of the recess and precleaning step may cause removal of material from the device that is undesired, and may cause issues during subsequent semiconductor processing steps such as contact formation. For example, a divot may be formed in a shallow trench isolation (STI) region of the device during precleaning. The presence of divot may cause faceting in material that is subsequently epitaxially deposited on or near the STI region. Faceting may reduce to total volume of the deposited material, which may cause, for example, an epitaxially deposited source/drain region to have insufficient height to make good contact with the electrical contacts to the device.

BRIEF SUMMARY

In one aspect, a method for formation of a sealed shallow trench isolation (STI) region for a semiconductor device includes forming a STI region in a substrate, the STI region comprising a STI fill; forming a sealing recess in the STI fill of the STI region; and forming a sealing layer in the sealing recess over the STI fill.

In another aspect, a method for formation of a sealed shallow trench isolation (STI) region for a semiconductor device includes forming a STI region in a substrate; and forming a sealing layer comprising one of a high-k material and silicon nitride (SiN) over a top surface of the STI region.

In another aspect, a semiconductor device includes a shallow trench isolation (STI) region located in a substrate, the STI region comprising a sealing layer located in a sealing recess on top of a STI fill of the STI region.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of a sealed STI region, and method of forming a sealed STI region, are provided, with exemplary embodiments being discussed below in detail. The STI regions in an IC may be sealed with a sealing layer comprising a material that is resistant to HF, which prevents formation of divots in the STI regions during the precleaning step that may be performed before epitaxial deposition of source/drain material. The sealing layer may comprise a high-k (HK) material, such as hafnium oxide (HfO), in some embodiments, or may comprise silicon nitride (SiN) in other embodiments. The sealing layer may be formed on top of the STI region, such that a top surface of the sealing layer is coplanar with the top surface of the substrate, thereby reducing topology issues in subsequent semiconductor processing steps. In further embodiments, the sealing material may be additionally used to form a sealing liner inside the STI region that is located between the substrate and the STI fill. The STI sealing layer may also serve as etch stop during contact formation, which enables contact routing over the STI regions in the IC.

Figure 1:
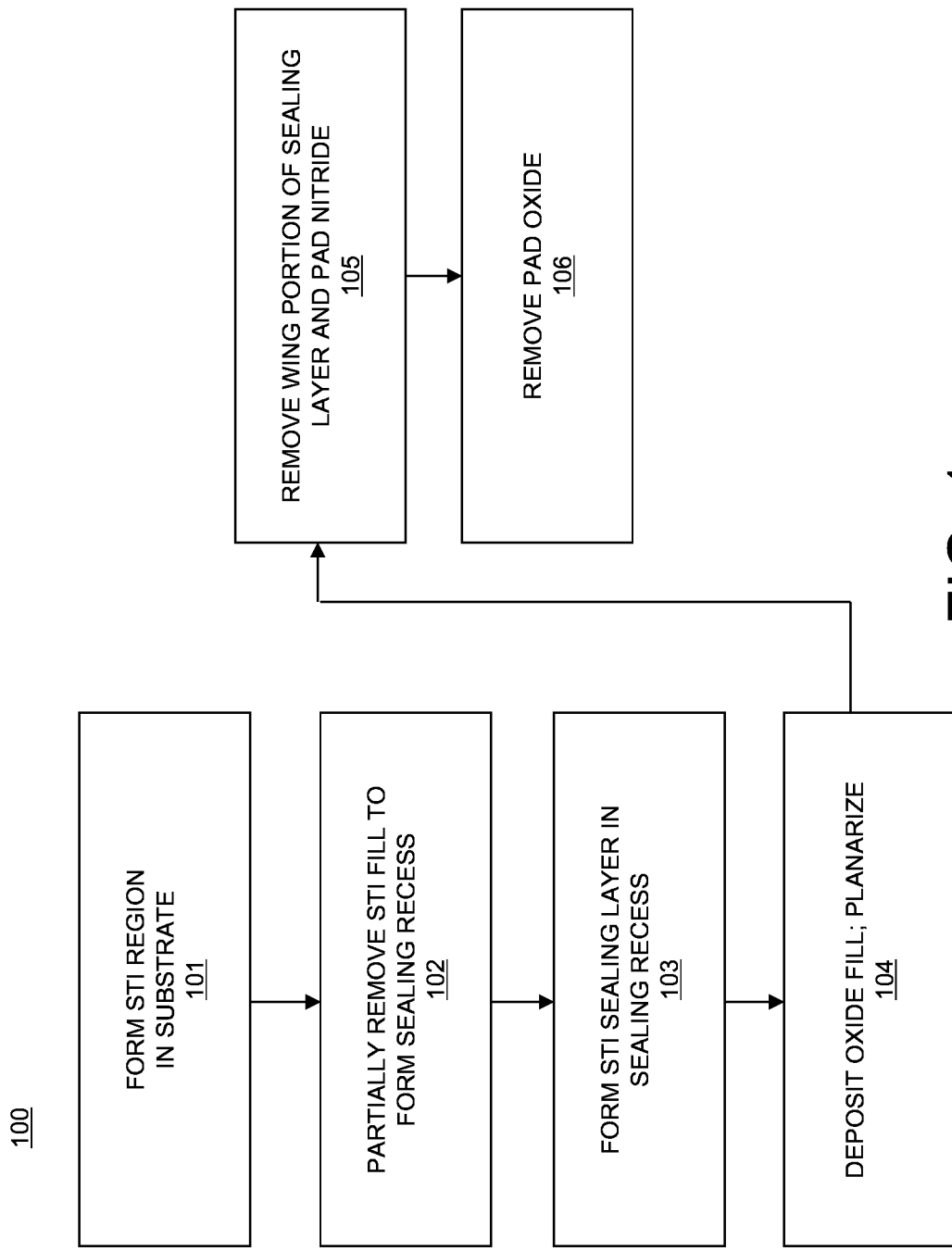
FIG. 1 illustrates a flowchart of an embodiment of a method of forming a sealed STI region.
Figure 2:
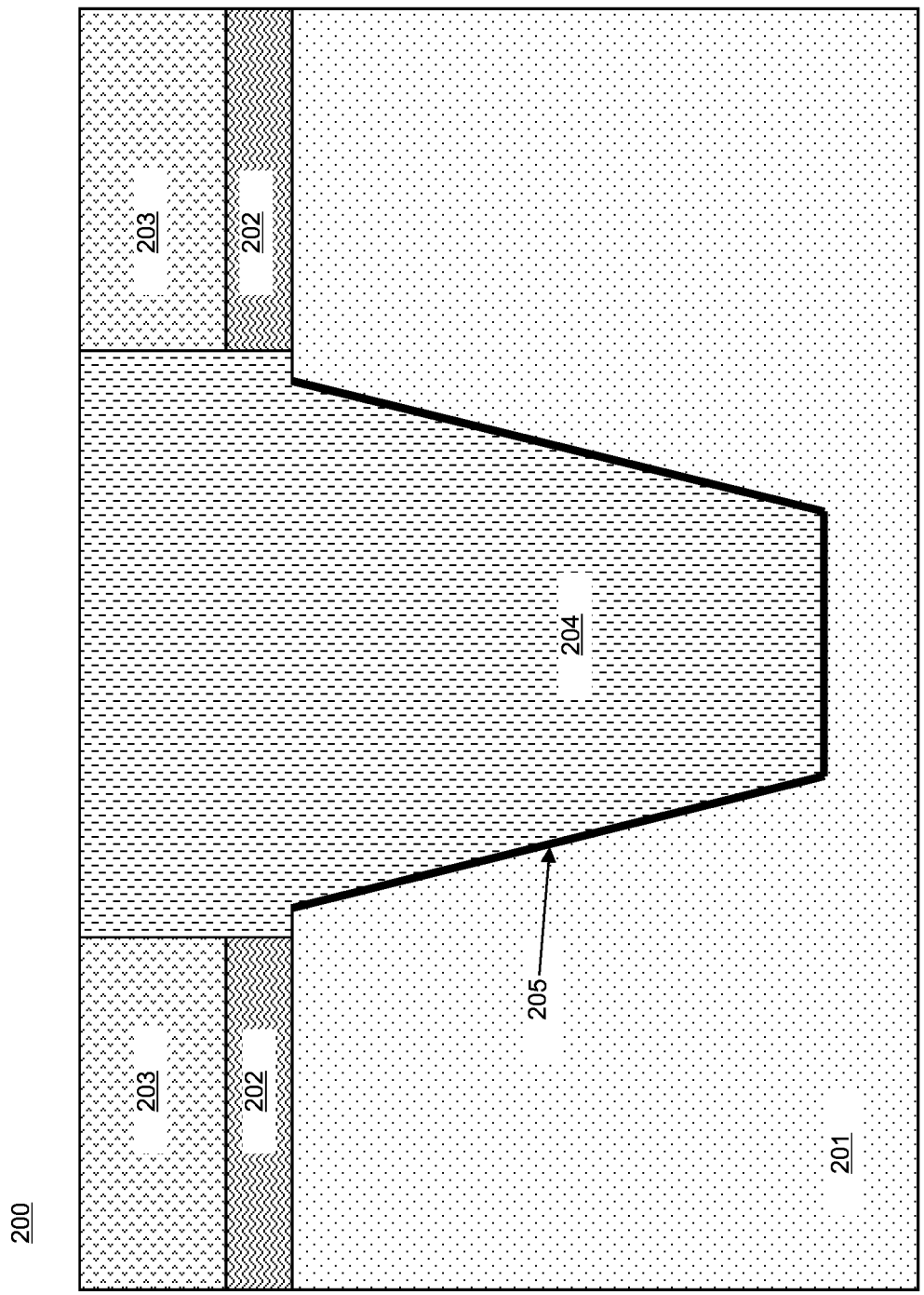
FIG. 2 is a cross sectional view illustrating an embodiment of a STI region in a substrate.

FIG. 1 illustrates a flowchart of an embodiment of a method 100 of forming a sealed STI region. FIG. 1 is discussed with respect to FIGS. 2-8. First, in block 101 of method 100, a STI region is formed in a substrate. The STI region is located in a recess in the substrate, and may comprise a STI liner and a STI fill. The STI liner and the STI fill may comprise oxide, and the substrate may comprise silicon in various embodiments. FIG. 2 illustrates an embodiment of a device 200 including a STI region, comprising STI liner 205 and STI fill 204, in a substrate 201. Device 200 additionally includes pad oxide 202 and pad nitride 203, which are located on top of the substrate 201 on either side of the STI region comprising STI liner 205 and STI fill 204. Pad oxide 202 and pad nitride 203 may act as stopping layers during planarization of the STI region, which may be performed during formation of the STI region; therefore, the top of STI fill 204 may be level with the top of the pad nitride 203.

Figure 3:
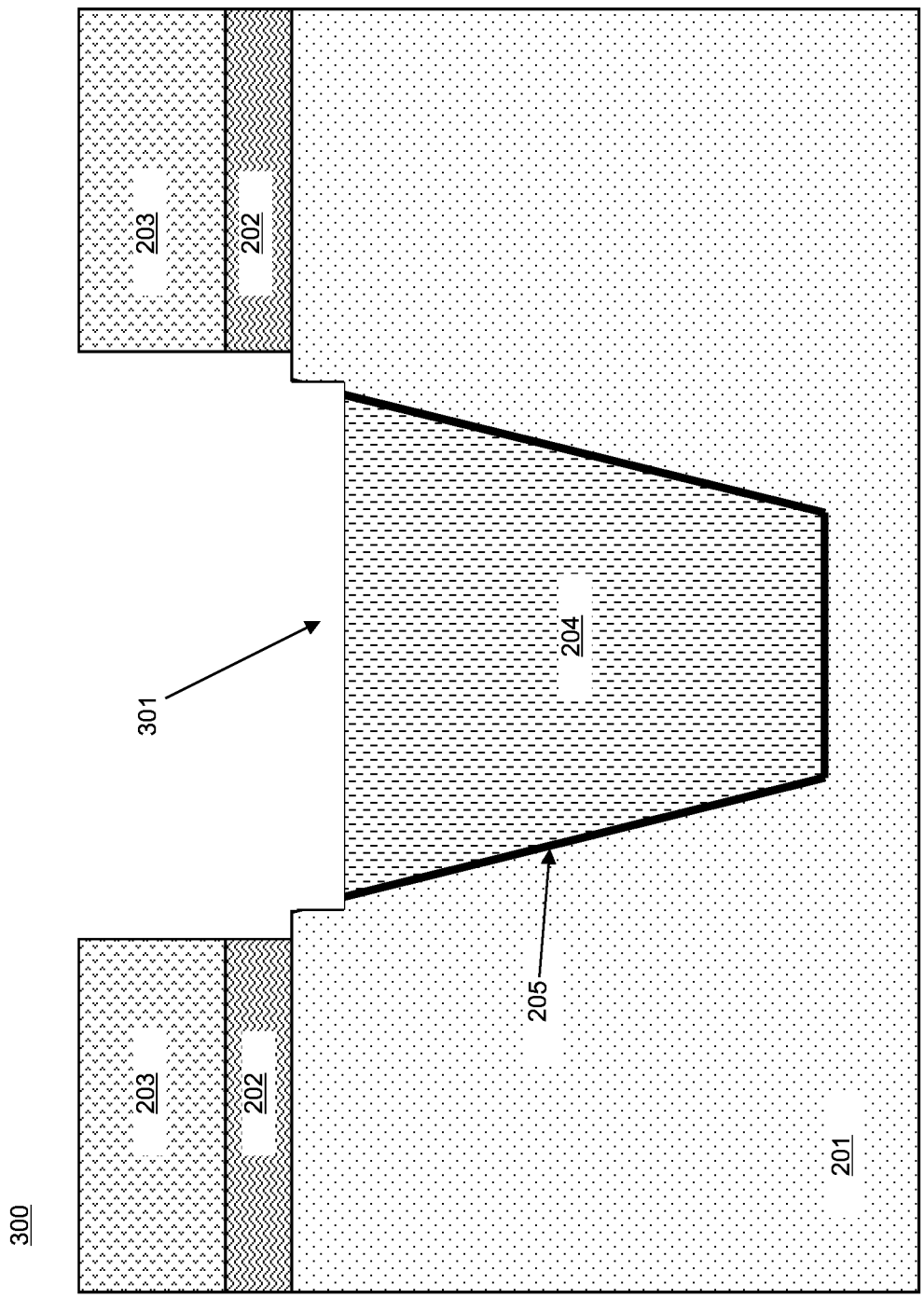
FIG. 3 illustrates the device of FIG. 2 after partial removal of the STI fill to form a sealing recess.

Flow of method 100 then proceeds to block 102, in which the STI fill of the STI region is partially removed to form a sealing recess. The partial removal of the STI fill may be performing using a wet etch, which may include a HF acid etch, or plasma RIE in various embodiments. The oxide fill is removed to a level below the top surface of the substrate. FIG. 3 illustrates an embodiment of the device 200 of FIG. 2 after partial removal of the STI fill 204 to form sealing recess 301. Sealing recess 301 extends below the top surface of the substrate 201.

Figure 4:
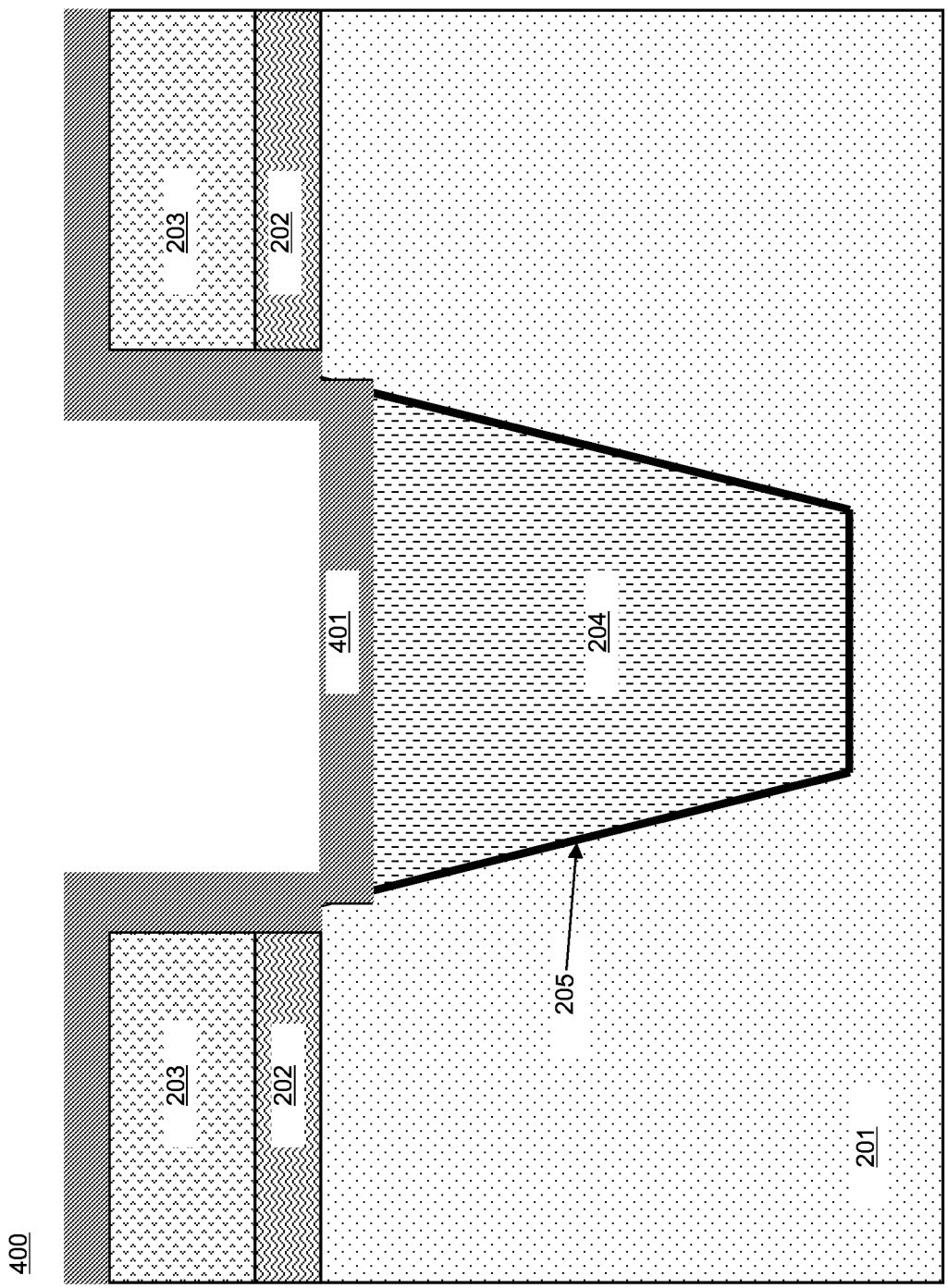
FIG. 4 illustrates the device of FIG. 3 after formation of a STI sealing layer in the sealing recess.

Next, in block 103 of FIG. 1, a sealing layer is formed in the sealing recess over the STI region. The sealing layer may comprise a HK material, including but not limited to HfO, or SiN in various embodiments. The material that comprises the sealing layer may be selected for resistance to HF etching, and may be deposited by conformal deposition in various embodiments. The sealing layer may be formed such that a portion of the sealing layer that is located on top of the STI fill is coplanar with a top surface of the substrate. The deposition process used to form the sealing layer in block 103 may be performed such that the thickness of the sealing layer is about equal to the depth of the sealing recess. FIG. 4 illustrates an embodiment of the device 300 of FIG. 3 after formation of a sealing layer 401. Sealing layer 401 is formed over the exposed surfaces of the STI fill 204, pad oxide 202, and pad nitride 203.

Figure 5:
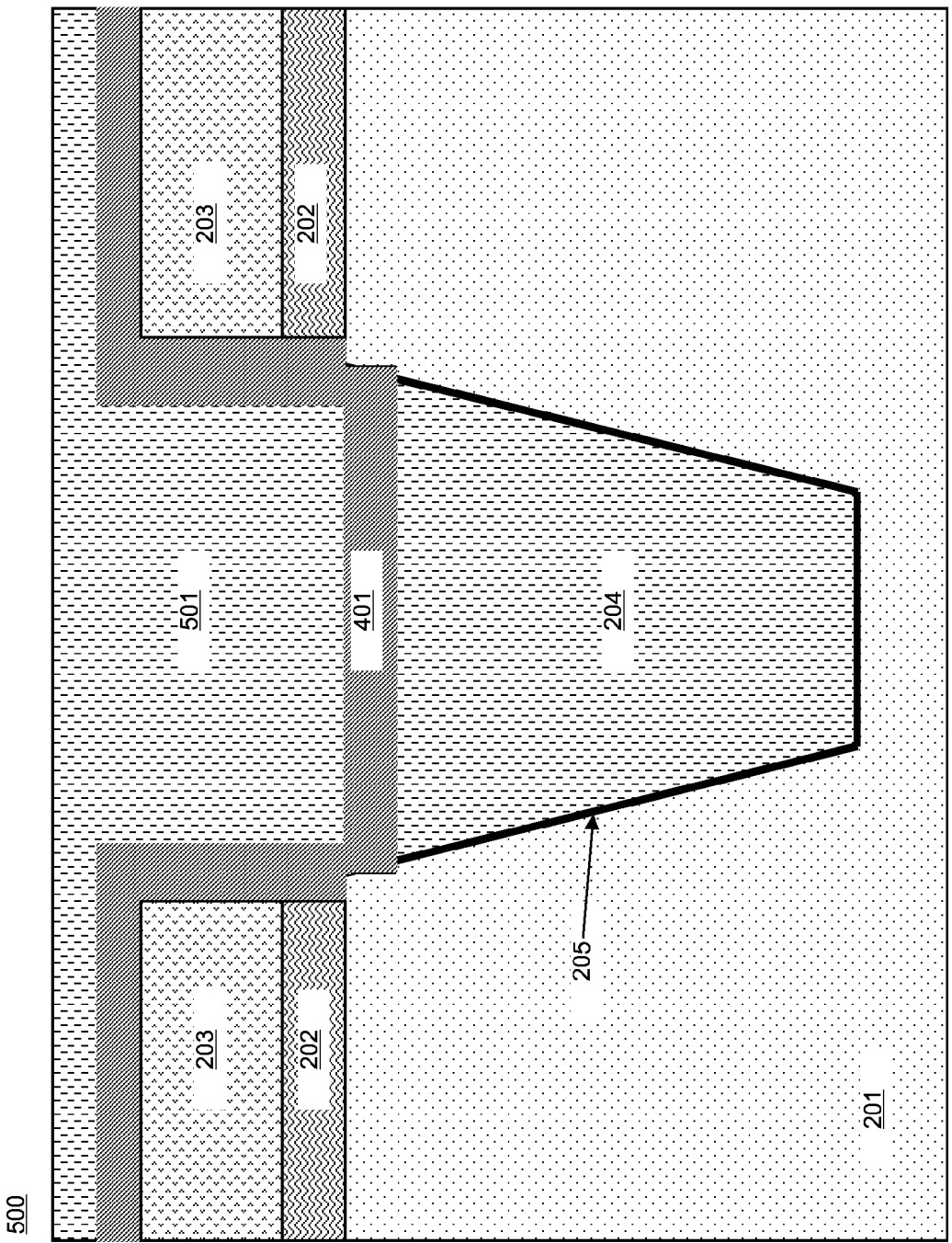
FIG. 5 illustrates the device of FIG. 4 after deposition of oxide over the STI sealing layer.
Figure 6:
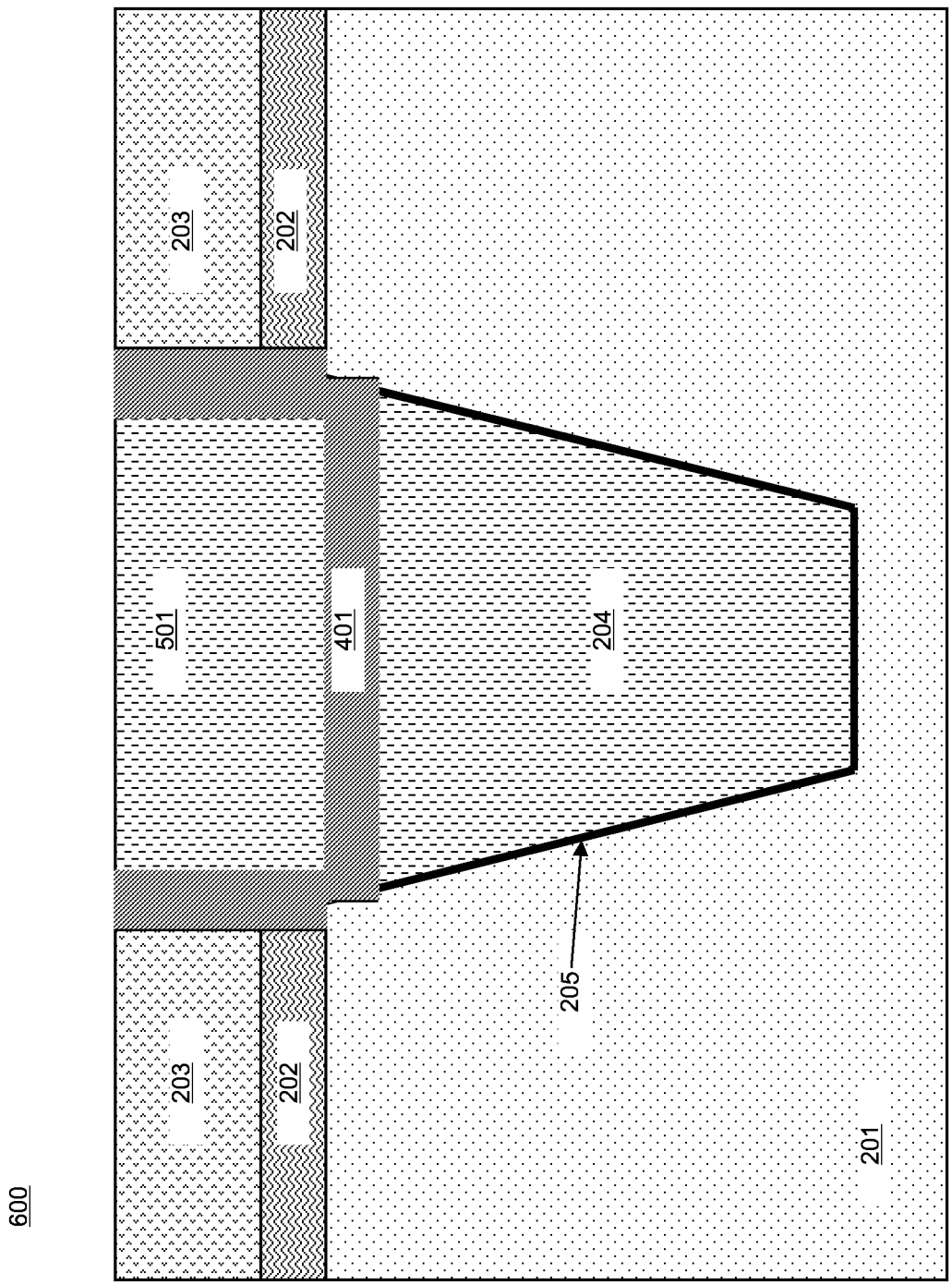
FIG. 6 illustrates the device of FIG. 5 after planarization of the oxide.

Proceeding to block 104 of FIG. 1, an oxide fill is deposited over the sealing layer, and the top of the deposited oxide fill is planarized down to the top of the pad nitride. The planarization process may be a CMP process in various embodiments. The planarization also removes a portion of the sealing layer that is located on top of the pad nitride. FIG. 5 illustrates an embodiment of the device 400 of FIG. 4 after deposition of the oxide fill 501 over the sealing layer 401, and FIG. 6 illustrates an embodiment of the device 500 of FIG. 5 after planarization of the oxide fill 501 down to the top of pad nitride 203. A portion of the sealing layer 401 that was located on top of the pad nitride 203 is removed by the planarization.

Figure 7A:
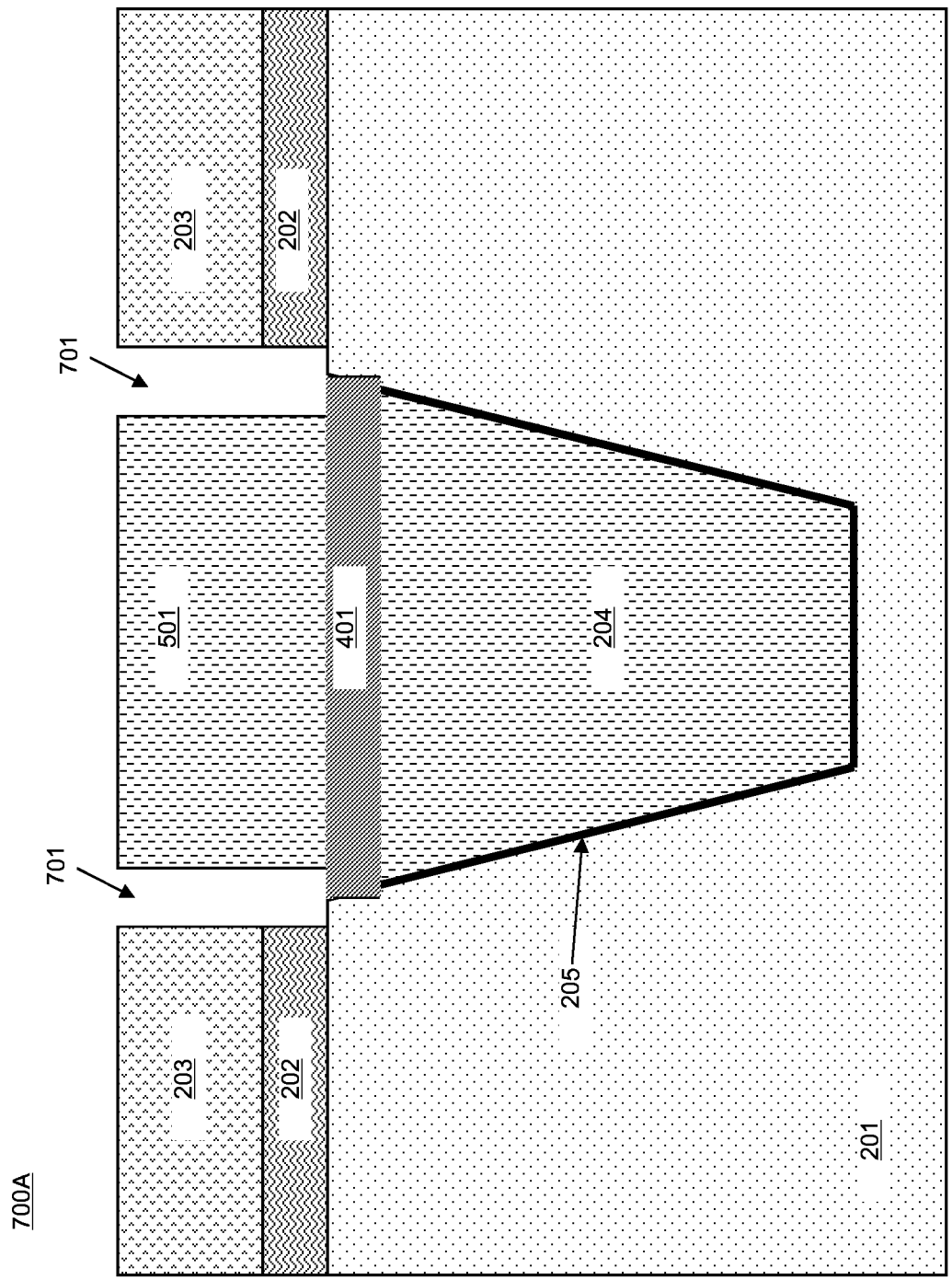
FIG. 7A illustrates the device of FIG. 6 after removal of a wing portion of the STI sealing layer.
Figure 7B:
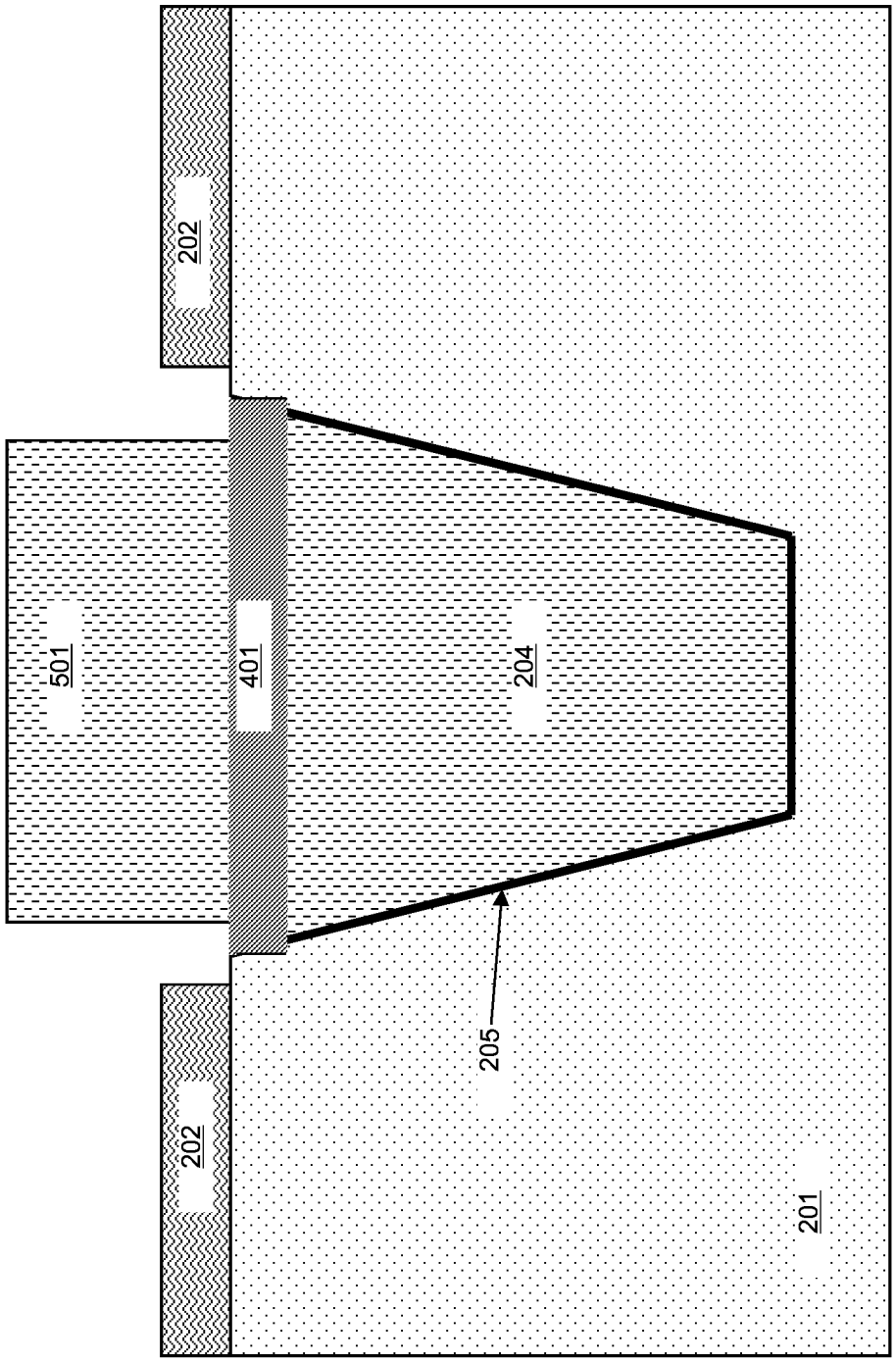
FIG. 7B illustrates the device of either of FIG. 6 or 7A after removal of pad nitride.

Turning again to FIG. 1, next, in block 105, the pad nitride and a vertical wing portion of the sealing layer are removed. The wing portion of the sealing layer is located in the areas that are located between the sides of the remaining oxide fill and the pad oxide and nitride. In a first embodiment of the flow of block 105 of FIG. 1, in which the sealing layer comprises a HK material, the wing portion of the sealing layer is removed first, and the pad nitride is subsequently removed. The removal of the wing portion of the sealing layer may comprise a wet or dry etch in various embodiments, and the subsequent removal of the pad nitride may comprise RIE, or a wet phosphoric acid etch, in various embodiments. The etch time may be controlled so that the etch performed in block 105 stops before the level of the top of the substrate, such that the STI fill is not exposed by the etch. In further embodiments, an amorphization implant of the wing portion of the sealing layer may be performed before the etch. The amorphization implant may have an amorphization depth that is about equal to the level of the top of the substrate, so as to increase the etch selectivity between the wing portion of the sealing layer and the portion of the sealing layer that is located on top of the STI fill. FIG. 7A illustrates an embodiment of the device 600 of FIG. 6 after removal of the wing portion of the sealing layer 401. The removal of the wing portion of the sealing layer 401 forms wing recesses 701 between pad oxide and nitride 202/203 and the oxide fill 501. FIG. 7B illustrates an embodiment of the device 700A of FIG. 7A after subsequent removal of the pad nitride 203. In a second embodiment of the flow of block 105 of FIG. 1, in which the sealing layer comprises SiN, the wing portion of the sealing layer and the pad nitride are removed simultaneously. The simultaneous removal of the wing portion of the sealing layer and the pad nitride may comprise RIE, or a wet phosphoric acid etch, which may be a hot etch, in various embodiments. FIG. 7B also illustrates an embodiment of the device 600 of FIG. 6 after simultaneous removal of the wing portion of the sealing layer 401 and the pad nitride 203.

Figure 8:
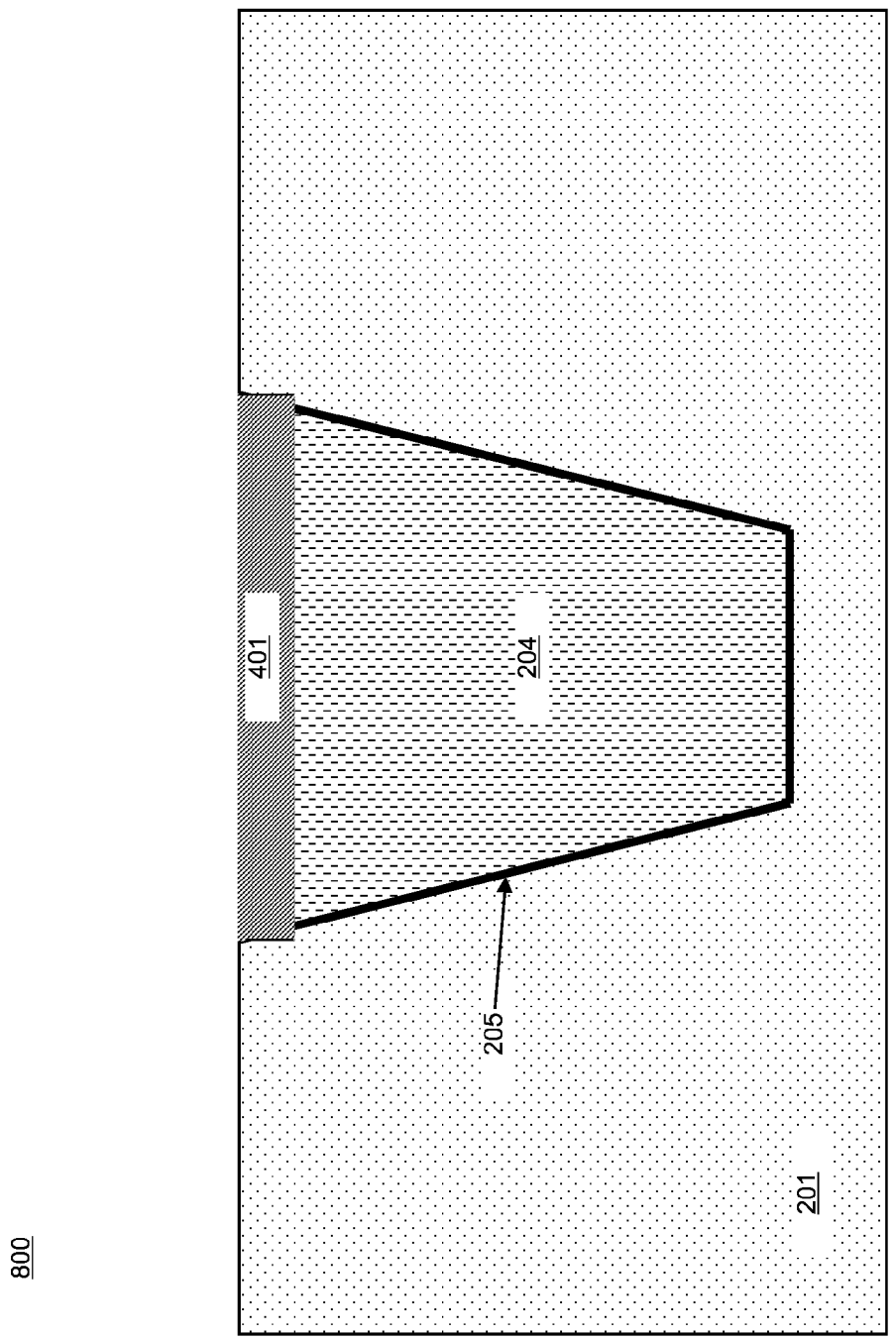
FIG. 8 illustrates an embodiment of a semiconductor device with a sealed STI region.

Lastly, flow of FIG. 1 proceeds to block 106, in which the oxide fill and pad oxide are removed, resulting in a device comprising a sealed STI region. The removal of the oxide fill and pad oxide may comprise a HF etch, RIE, or CMP in various embodiments. The oxide removal process that is used in block 106 of FIG. 1 may be selected such that the sealing layer is not removed during block 106. The particular oxide removal process that is used in block 106, and its selectivity to oxide over the material that comprises the sealing layer, determines the process window that is needed in block 106 for removing the oxide fill and pad oxide while preserving the sealing layer. If this process window is relatively small, then an annealing of the device may be necessary before removing the oxide fill and pad oxide. Annealing of the device before removal of the oxide fill and pad oxide may cause the sealing layer to become crystallized, increasing the resistance of the sealing layer to the etching or CMP that may be used for the oxide removal process of block 106. FIG. 8 illustrates an embodiment of the device 700B of FIG. 7B after removal of the oxide fill and pad oxide. Device 800 includes a STI region, including STI fill 204 and STI liner 205, that is sealed at the top by sealing layer 401. The top of sealing layer 401 is coplanar with the top surface of the substrate 201.

Figure 9:
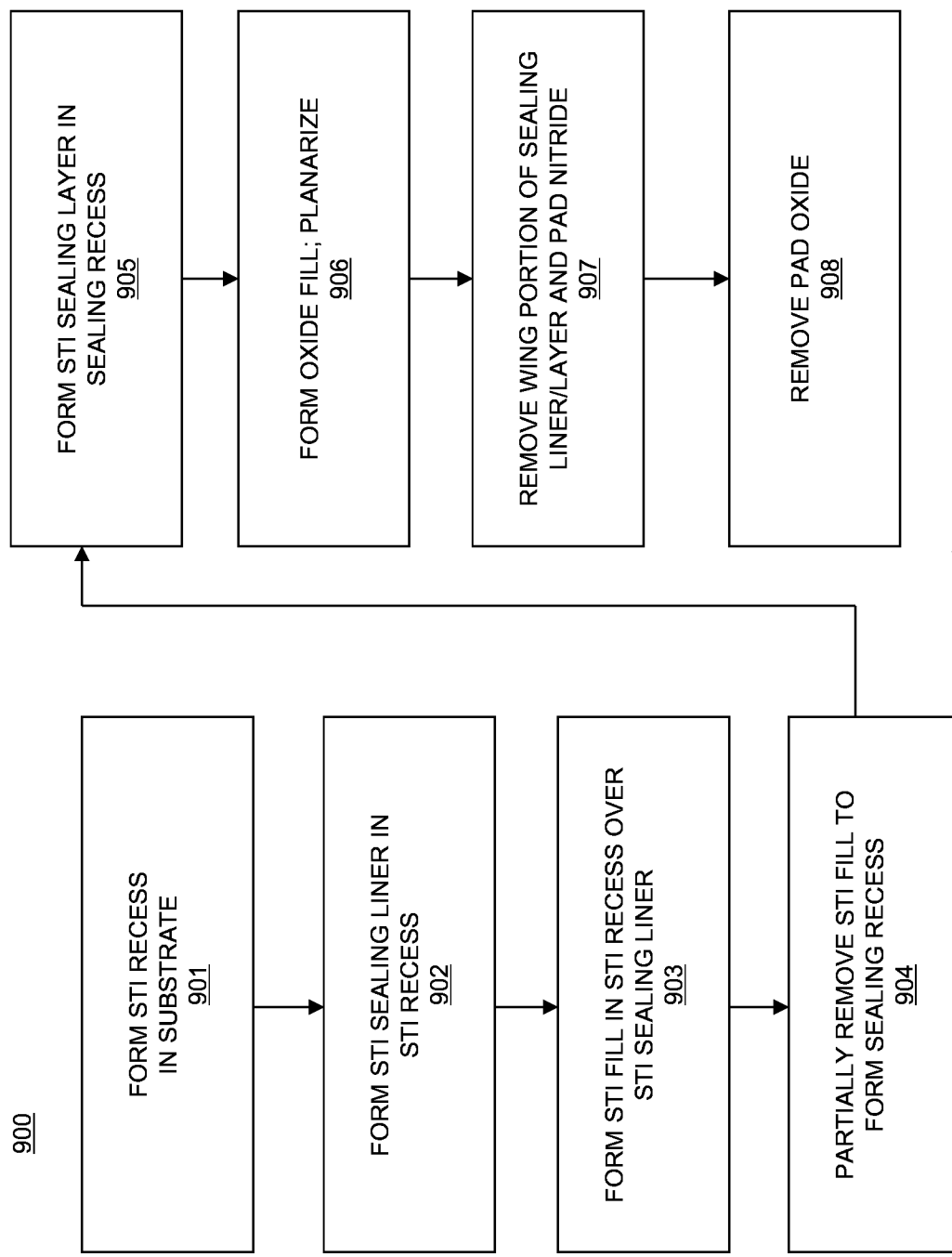
FIG. 9 illustrates a flowchart of another embodiment of a method of forming a sealed STI region.
Figure 10:
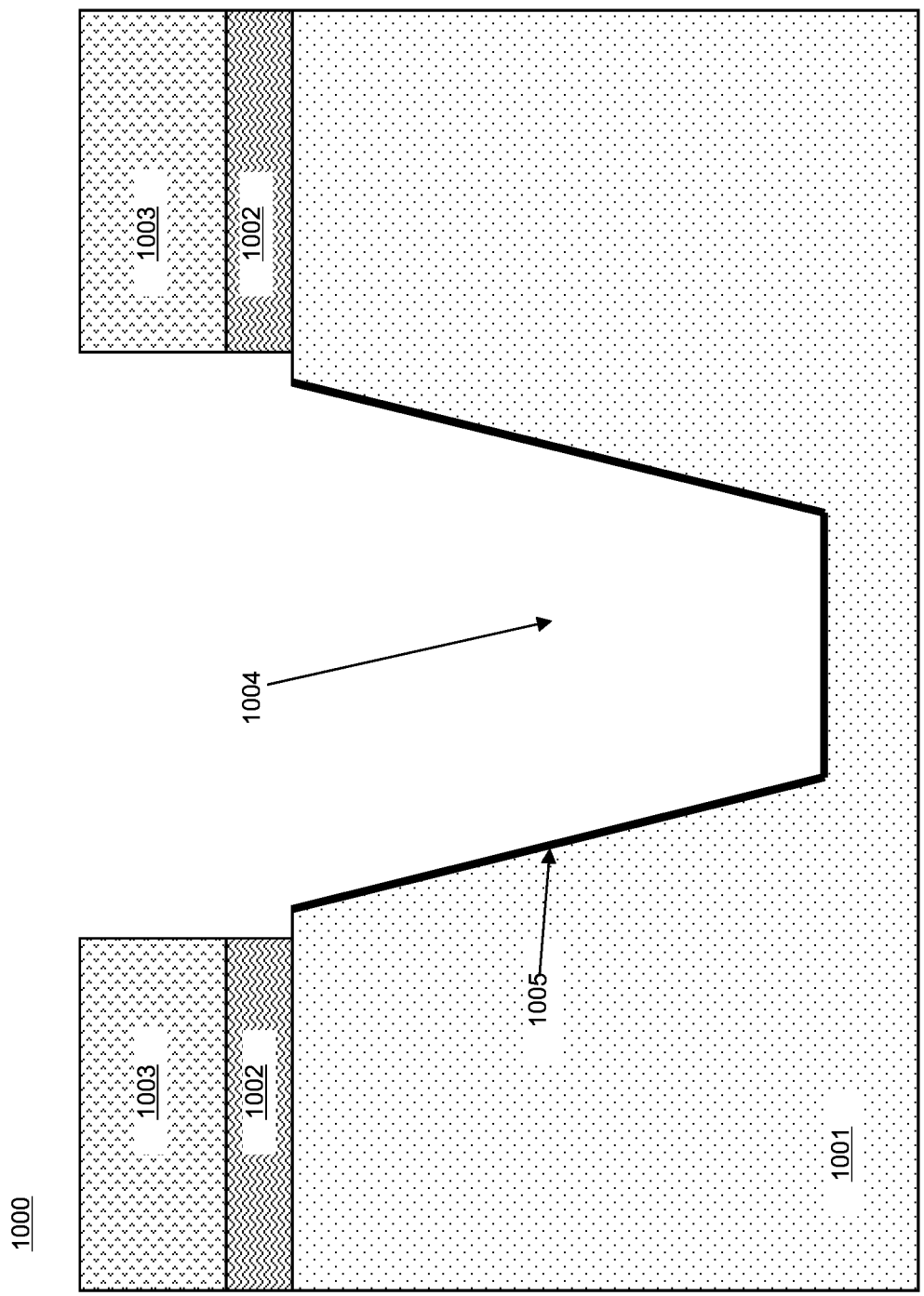
FIG. 10 is a cross sectional view illustrating an embodiment of a STI recess and liner in a substrate.

FIG. 9 illustrates a flowchart of another embodiment of a method 900 of forming a sealed STI region including a sealing liner within the STI region. FIG. 9 is discussed with respect to FIGS. 10-18. First, in block 901 of method 900, a STI recess is formed in a substrate. In some embodiments, a STI liner may be formed in the recess; in other embodiments, the STI liner may be omitted. The STI liner may comprise oxide in some embodiments. The substrate may comprise silicon in some embodiments. FIG. 10 illustrates an embodiment of a device 1000 including a STI recess 1004 in a substrate 1001. An optional STI liner 1005 is located over the exposed surfaces inside the STI recess 1004. Device 1000 additionally includes pad oxide 1002 and pad nitride 1003, which are located on top of the substrate 1001 on either side of the STI recess 1004.

Figure 11:
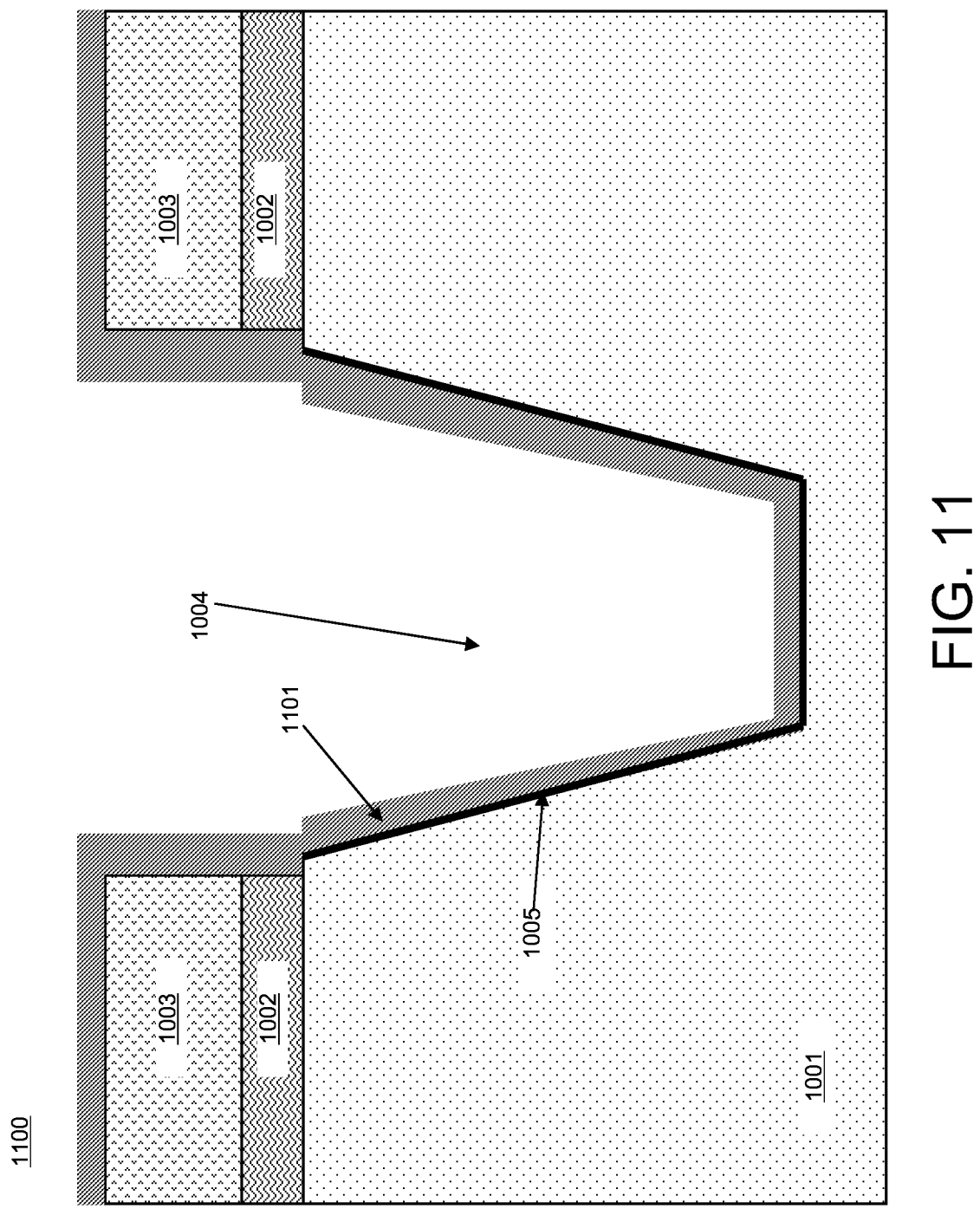
FIG. 11 illustrates the device of FIG. 10 after formation of a STI sealing liner in the recess.

Next, in block 902 of FIG. 9, a sealing liner is formed in the STI recess. The sealing liner may comprise a HK material, including but not limited to HfO, or SiN in various embodiments. The material that comprises the sealing liner may be selected for resistance to HF etching. FIG. 11 illustrates an embodiment of the device 1000 of FIG. 10 after formation of a sealing liner 1101 in the STI recess 1004. As shown in FIG. 10, the sealing liner 1101 covers the STI liner 1005, and also covers the pad oxide 1002 and pad nitride 1003. In some embodiments, the STI liner 1005 may be omitted, and the sealing liner 1101 may be formed directly on the surface of the substrate 1001 in the STI recess 1004.

Figure 12:
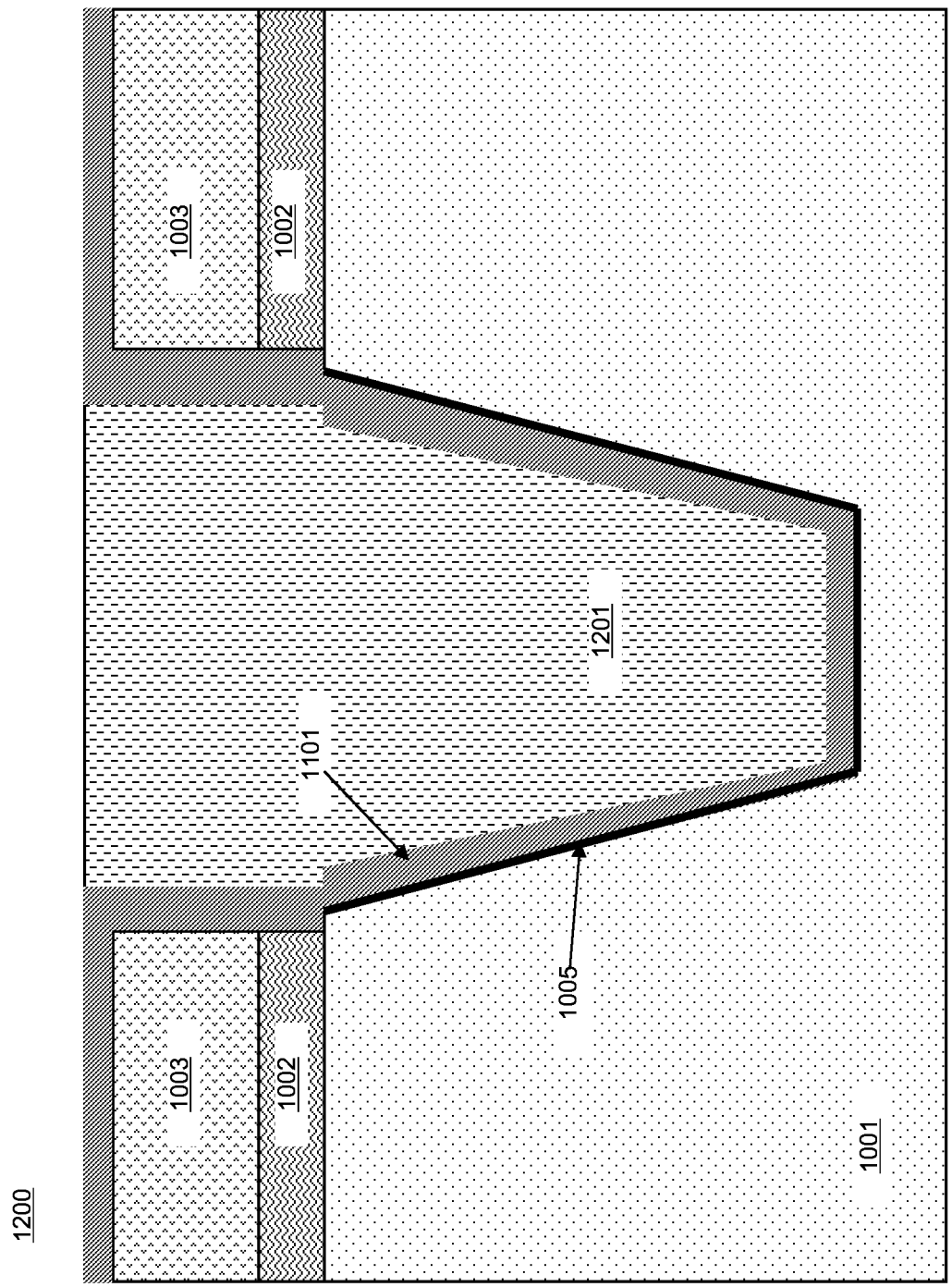
FIG. 12 illustrates the device of FIG. 11 after formation of STI fill.

Flow then proceeds to block 903 of FIG. 9, in which a STI fill is formed over the sealing liner in the STI recess. The STI fill may comprise oxide in various embodiments. The STI fill may be formed by deposition of oxide over the sealing liner followed by planarization of the deposited oxide down to the top surface of the portion of the sealing liner that is located on top of the pad nitride. The planarization process may be a CMP process. FIG. 12 illustrates an embodiment of the device 1100 of FIG. 11 after formation of STI fill 1201 over the sealing liner 1101. The top of STI fill 1201 is level with the top surface of the portion of sealing liner 1101 that is located on top of pad nitride 1003.

Figure 13:
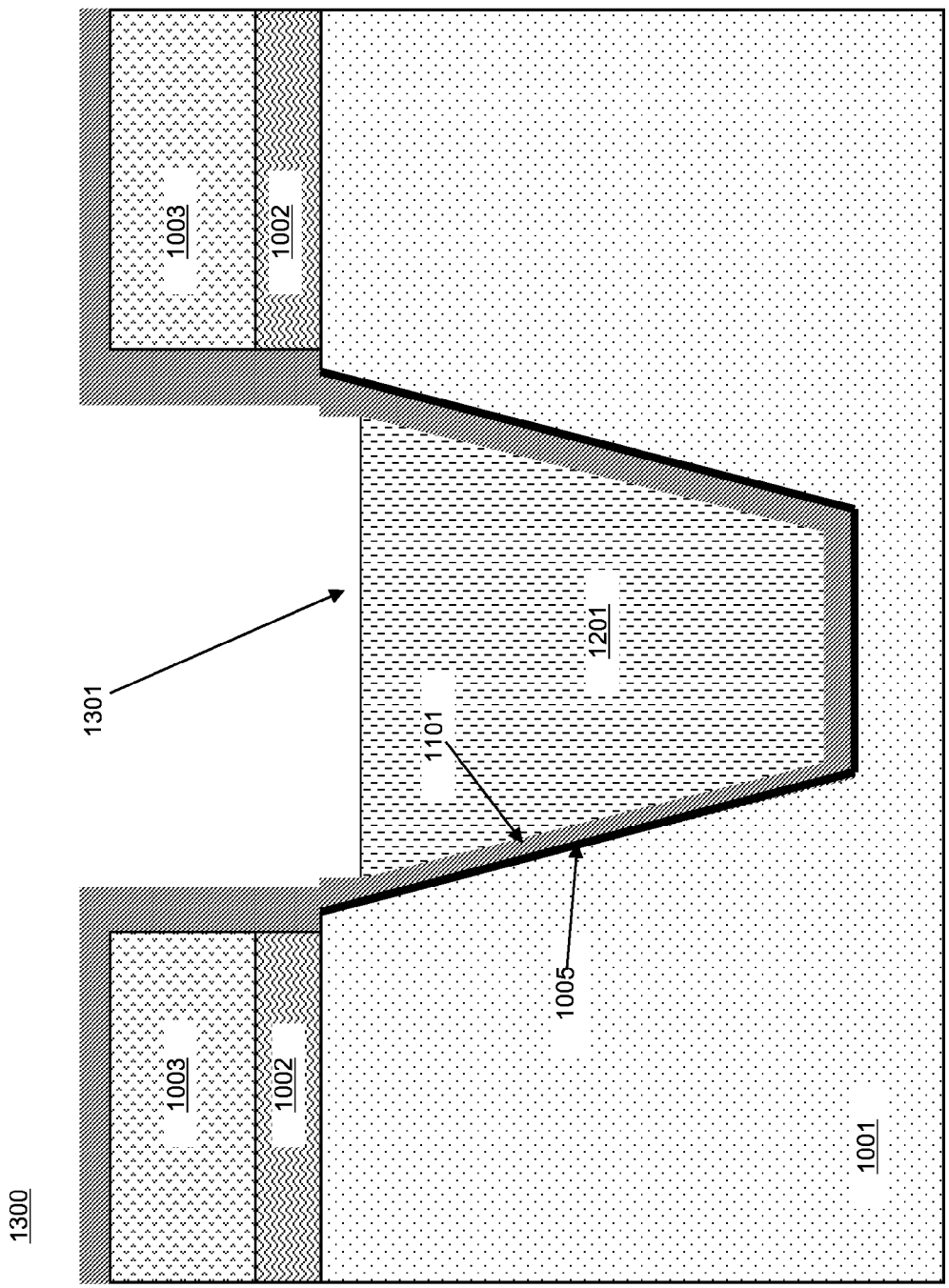
FIG. 13 illustrates the device of FIG. 12 after partial removal of the STI fill to form a sealing recess.

Flow of method 900 then proceeds to block 904, in which the STI fill of the STI region is partially removed to form a sealing recess. The partial removal of the STI fill may be performing using a wet etch, which may be a hydrofluoric (HF) acid etch or a plasma RIE in various embodiments. The STI fill is removed to a level below the top surface of the substrate. FIG. 13 illustrates an embodiment of the device 1200 of FIG. 12 after partial removal of the STI fill 1201 to form sealing recess 1301. Sealing recess 1301 extends below the top surface of the substrate 1001.

Figure 14:
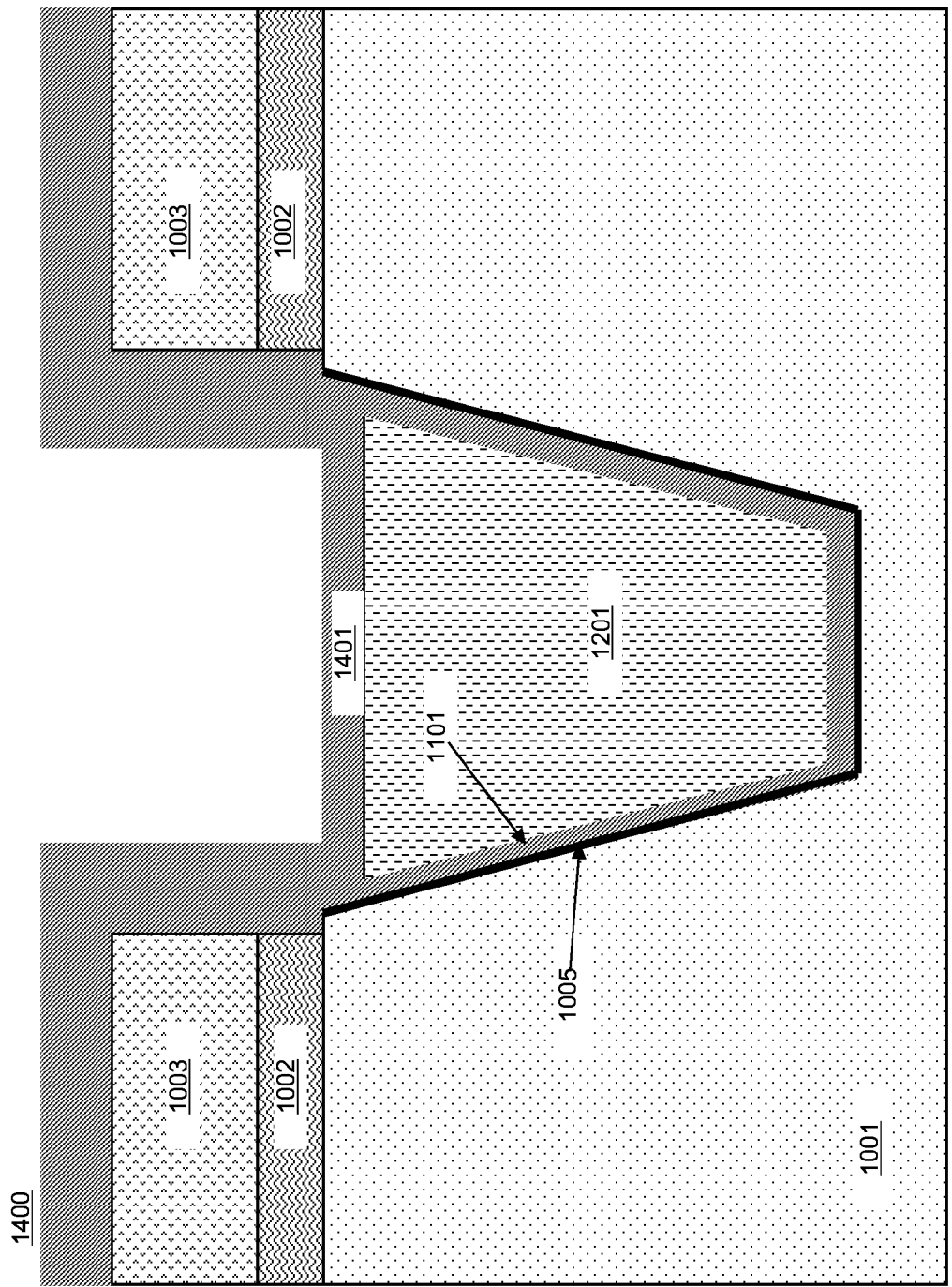
FIG. 14 illustrates the device of FIG. 13 after formation of a STI sealing layer in the sealing recess.

Next, in block 905 of FIG. 9, a sealing layer is formed in the sealing recess over the STI region. The sealing layer may comprise the same material as the sealing liner, which may be a HK material, including but not limited to HfO, or SiN in various embodiments. The material that comprises the sealing layer may be selected for resistance to HF etching, and may be deposited by conformal deposition in various embodiments. The sealing layer may be formed such that a portion of the sealing layer that is located on top of the STI fill is coplanar with a top surface of the substrate. The deposition process used to form the sealing layer in block 905 may be performed such that the thickness of the sealing layer is about equal to the depth of the sealing recess. FIG. 14 illustrates an embodiment of the device 1300 of FIG. 13 after formation of a sealing layer 1401. Sealing layer 1401 is formed over the exposed top surfaces of the STI fill 1201 and the top surface of the portion of the sealing liner 1101 that is located on top of the pad nitride 1003, and over the portion of the sealing liner 1101 remaining on the sides of the pad oxide 1002 and pad nitride 1003.

Figure 15:
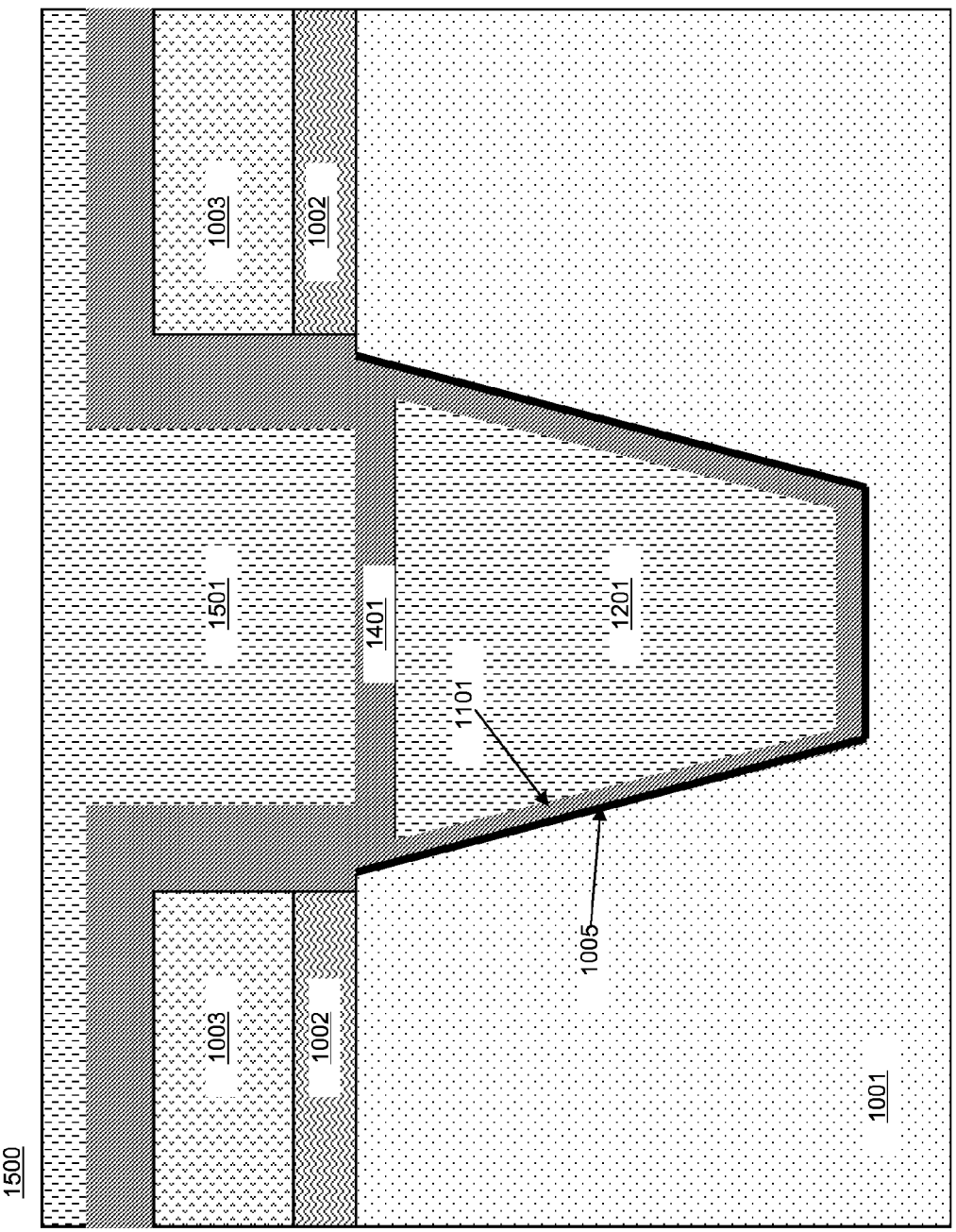
FIG. 15 illustrates the device of FIG. 14 after deposition of oxide over the STI sealing layer.
Figure 16:
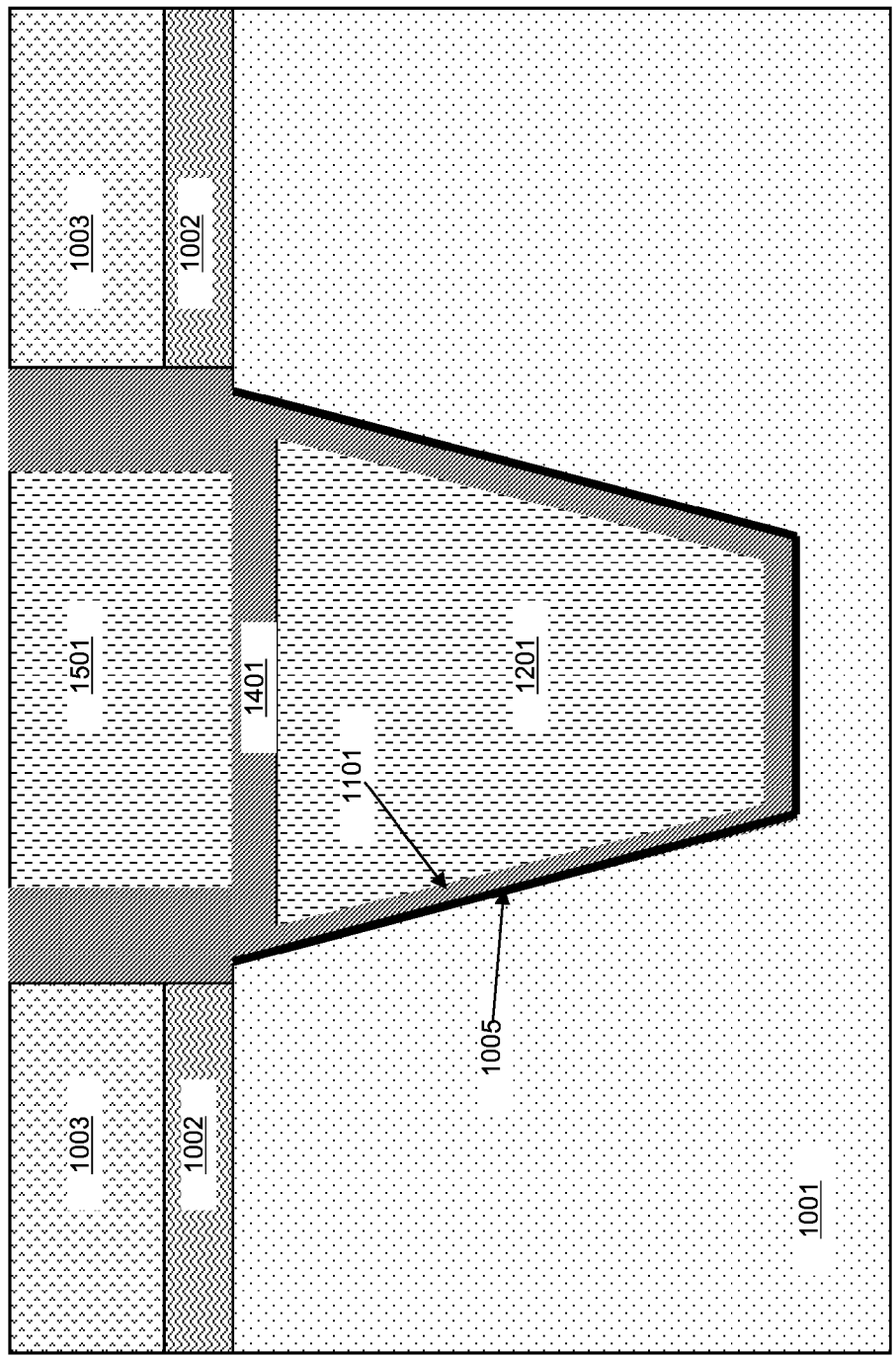
FIG. 16 illustrates the device of FIG. 15 after planarization of the oxide.

Proceeding to block 906 of FIG. 9, an oxide fill is deposited over the sealing layer, and the top of the deposited oxide fill is planarized down to the top of the pad nitride. The planarization process may be a CMP process. The planarization also removes a portion of the sealing layer that is located on top of the pad nitride. FIG. 15 illustrates an embodiment of the device 1400 of FIG. 14 after deposition of the oxide fill 1501 over the sealing layer 1401, and FIG. 16 illustrates an embodiment of the device 1500 of FIG. 15 after planarization of the oxide fill 1501 down to the top of pad nitride 1003. A portion of the sealing layer 1401 that was located on top of the pad nitride 1003 is removed by the planarization.

Figure 17A:
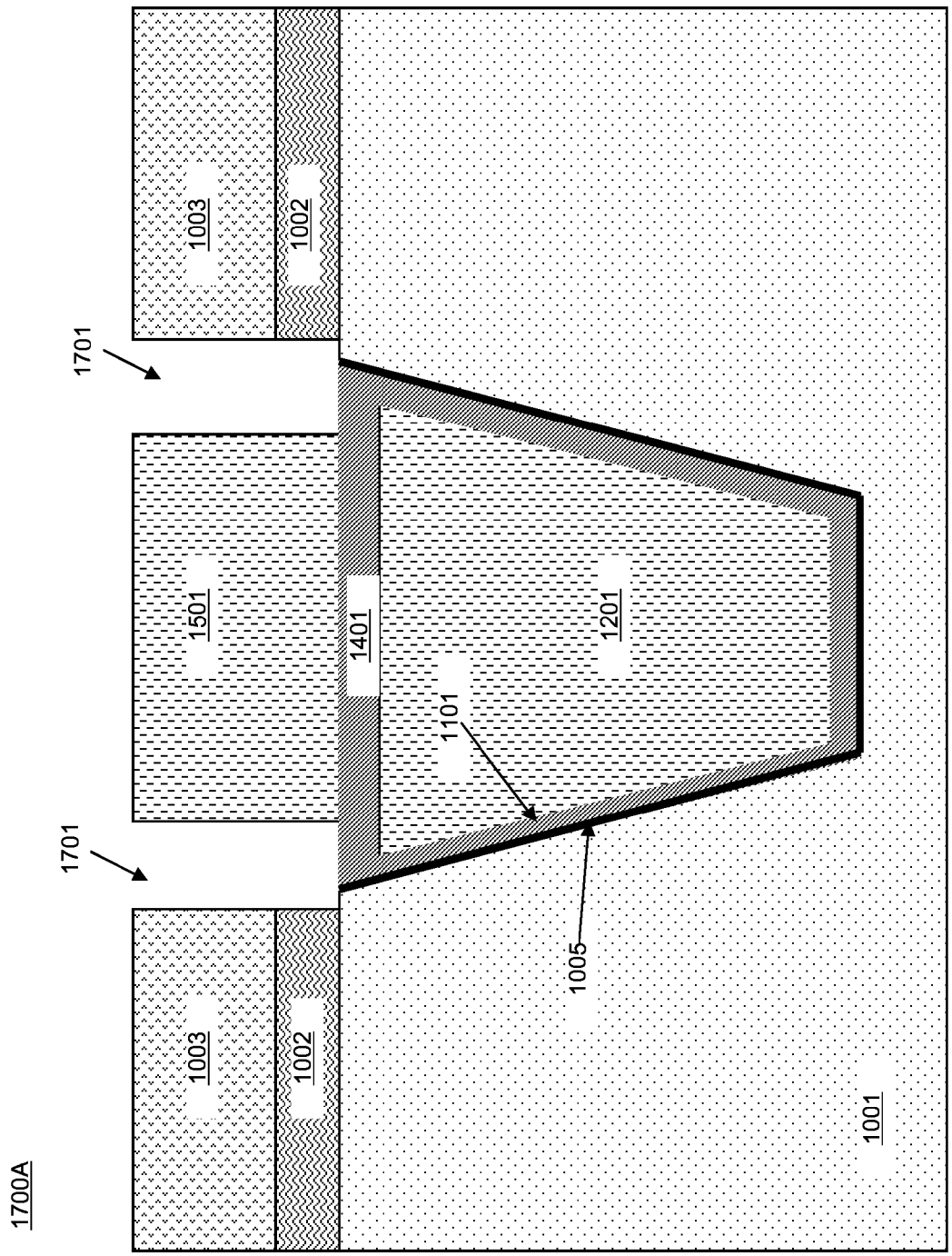
FIG. 17A illustrates the device of FIG. 16 after removal of a wing portion of the STI sealing layer.
Figure 17B:
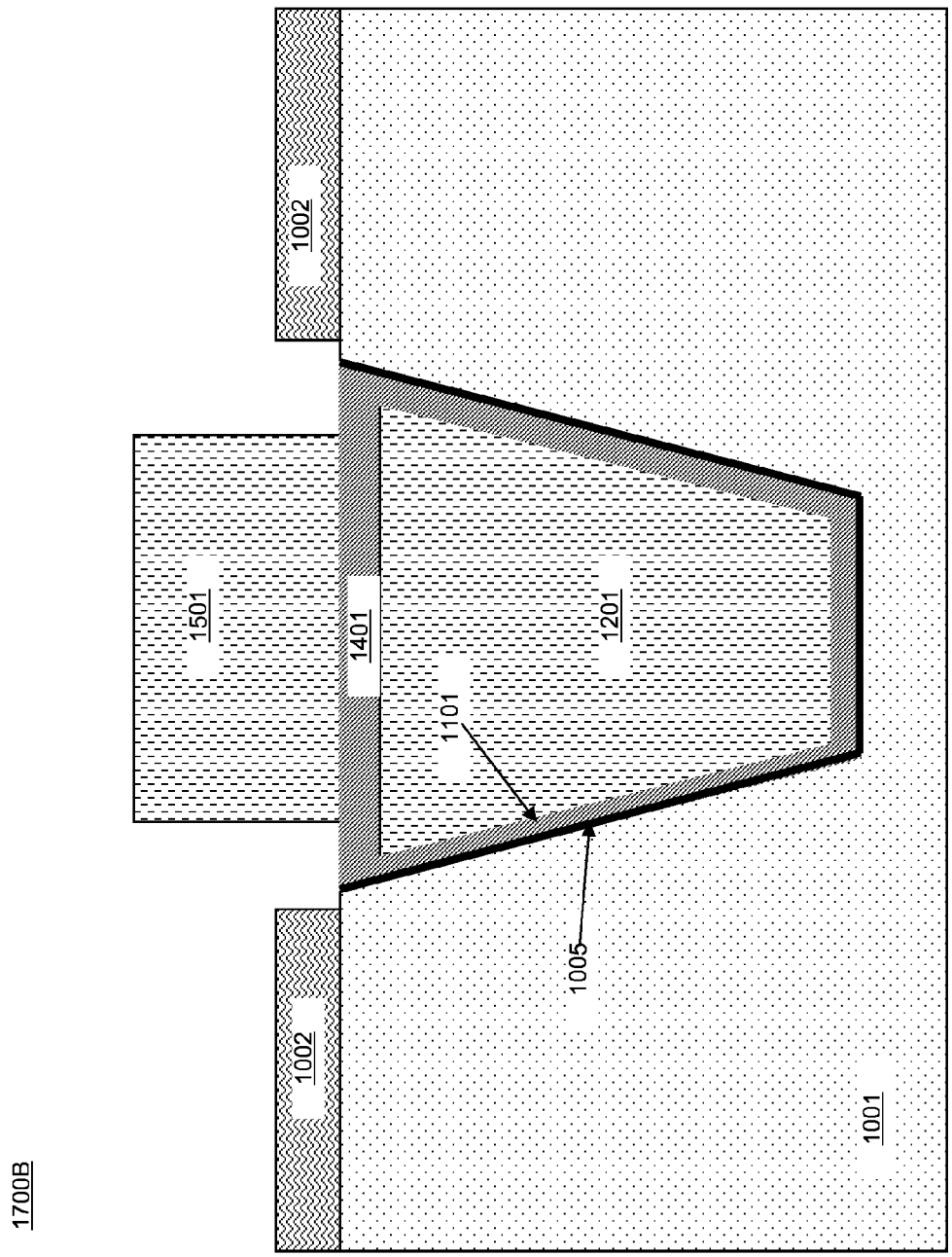
FIG. 17B illustrates the device of either of FIG. 16 or 17A after removal of pad nitride.

Turning again to FIG. 9, next, in block 907, the pad nitride and a vertical wing portion of the sealing liner and layer material are removed. The wing portion of the sealing liner/layer material is located in the areas that are located between the sides of the remaining oxide fill and the pad oxide and nitride. In a first embodiment of the flow of block 907 of FIG. 9, in which the sealing liner and layer comprises a HK material, the wing portion of the sealing liner/layer material is removed first, and the pad nitride is then removed. The removal of the wing portion of the sealing liner/layer material may comprise a wet or dry etch in various embodiments, and the subsequent removal of the pad nitride may comprise RIE, or a wet phosphoric acid etch in various embodiments. The etch time may be controlled so that the etch performed in block 907 stops before the level of the top of the substrate, such that the STI fill is not exposed by the etch. In further embodiments, an amorphization implant of the wing portion of the sealing layer may be performed before the etch. The amorphization implant may have an amorphization depth that is about equal to the level of the top of the substrate, so as to increase the etch selectivity between the wing portion of the sealing layer and the portion of the sealing layer that is located on top of the STI fill. FIG. 17A illustrates an embodiment of the device 1600 of FIG. 16 after removal of the wing portion of the sealing liner 1101 and sealing layer 1401. The removal of the wing portion of the sealing liner 1101 sealing layer 1401 forms wing recesses 1701 between pad oxide and nitride 1002/1003 and the oxide fill 1501. FIG. 17B illustrates an embodiment of the device 1700A of FIG. 17A after subsequent removal of the pad nitride 1003. In a second embodiment of the flow of block 907 of FIG. 9, in which the sealing liner and the sealing layer comprises SiN, the wing portion of the sealing liner/layer material and the pad nitride are removed simultaneously. The simultaneous removal of the wing portion of the sealing liner/layer material and the pad nitride may comprise RIE, or a wet phosphoric acid etch, which may be a hot etch, in various embodiments. FIG. 17B illustrates an embodiment of the device 1600 of FIG. 16 after simultaneous removal of the wing portion of the sealing liner 1101 and sealing layer 1401, and the pad nitride 1003.

Figure 18:
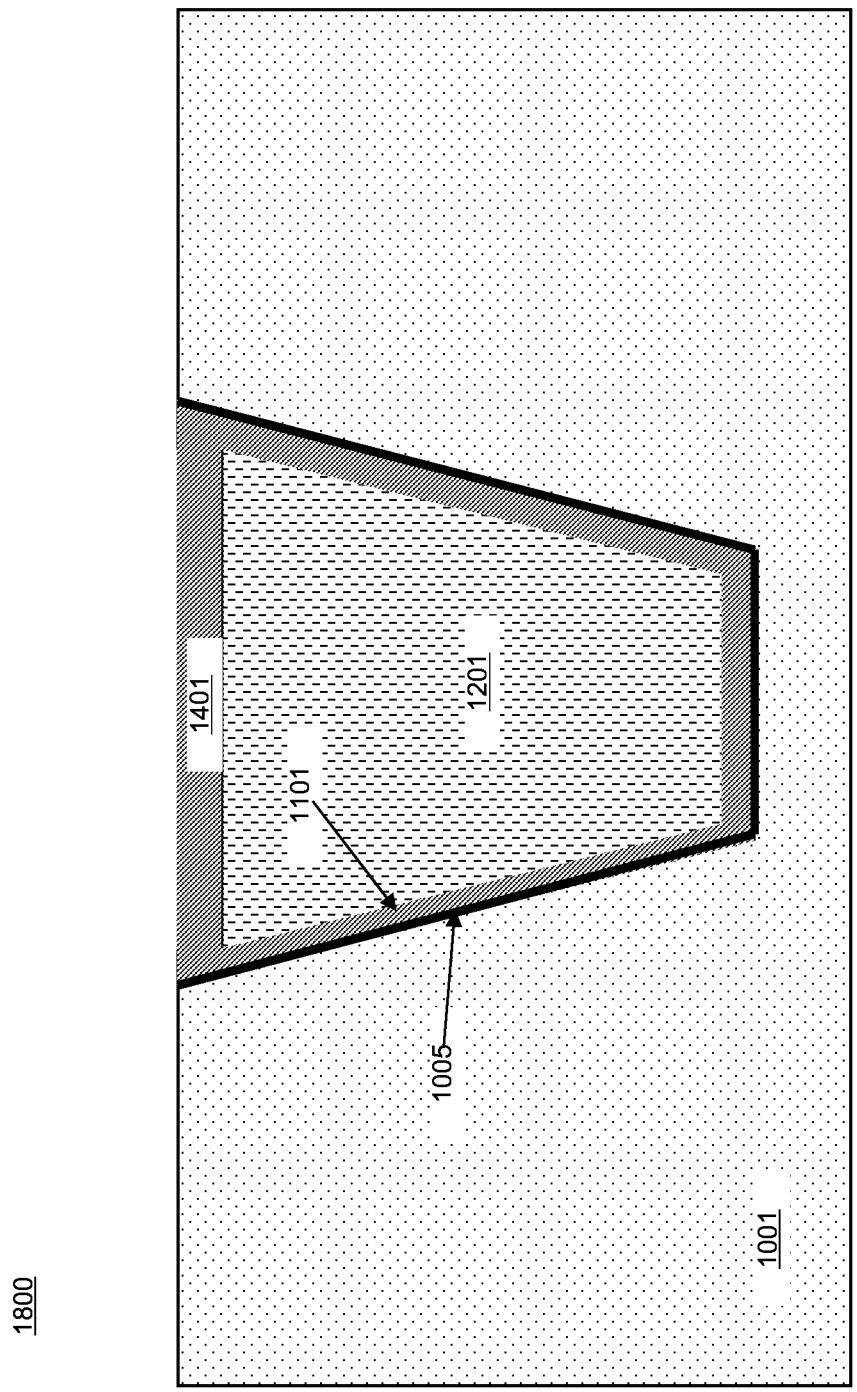
FIG. 18 illustrates an embodiment of a semiconductor device with a sealed STI region.

Lastly, flow of FIG. 9 proceeds to block 908, in which the oxide fill and pad oxide are removed, resulting in a device comprising a sealed STI region. The removal of the oxide fill and pad oxide may comprise a HF etch, RIE, or CMP in various embodiments. The oxide removal process that is used in block 908 of FIG. 9 may be selected such that the sealing layer is not removed during block 908. The particular oxide removal process that is used in block 908, and its selectivity to oxide over the material that comprises the sealing layer, determines the process window that is needed in block 908 for removing the oxide fill and pad oxide while preserving the sealing layer. If this process window is relatively small, then an annealing of the device may be necessary before removing the oxide fill and pad oxide. Annealing of the device before removal of the oxide fill and pad oxide may cause the sealing layer to become crystallized, increasing the resistance of the sealing layer to the etching or CMP that may be used for the oxide removal process of block 908. FIG. 18 illustrates an embodiment of the device 1700B of FIG. 17B after removal of the oxide fill and pad oxide. Device 1800 includes a STI region, including STI fill 1201 and optional STI liner 1005, that is sealed at the top by sealing layer 1401, and also inside the substrate 1001 by sealing liner 1101. The top of sealing layer 1401 is coplanar with the top surface of the substrate 1001.

The technical effects and benefits of exemplary embodiments include prevention of faceting during epitaxial deposition of source/drain material in and IC.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for formation of a sealed shallow trench isolation (STI) region for a semiconductor device, the method comprising:
    forming a STI region in a substrate, the STI region comprising a STI fill;
    forming a sealing recess in the STI fill of the STI region;
    forming a sealing layer in the sealing recess over the STI fill, wherein the sealing layer comprises a high-k (HK) material;
    forming an oxide fill over the sealing layer;
    planarizing a top surface of the oxide fill such that the top surface of the oxide fill is level with a top surface of a pad nitride layer, wherein the pad nitride layer is located on top of a pad oxide layer, the pad oxide layer being located on a top surface of the substrate, wherein a portion of the sealing layer is formed on top of the pad nitride layer, and wherein planarizing the top surface of the oxide fill removes the portion of the sealing layer that is located on top of the pad nitride layer;
    after planarizing the top surface of the oxide fill, removing a wing portion of the sealing layer, the wing portion of the sealing layer being located between the oxide fill and the pad nitride layer;
    removing the pad nitride layer after removing the wing portion of the sealing layer; and
    removing the pad oxide layer and the oxide fill after removing the pad nitride layer.

2. The method of claim 1, wherein forming the sealing layer in the sealing recess comprises depositing a material of the sealing layer in the sealing recess such that a thickness of the sealing layer is about equal to a depth of the sealing recess in the STI fill with respect to a top surface of the substrate.

3. The method of claim 1, wherein forming the STI region in the substrate comprises:
    forming a STI recess in the substrate;
    forming a sealing liner, the sealing liner comprising the same material as the sealing layer, in the STI recess; and
    forming the STI fill over the sealing liner.

4. The method of claim 1, further comprising performing an amorphization implant of the wing portion of the sealing layer before removal of the wing portion of the sealing layer, the amorphization implant having an amorphization depth that is about equal to a level of a top surface of the substrate.

5. The method of claim 4, further comprising annealing the sealing layer such that the sealing layer is crystallized by the anneal before removing the pad oxide layer and the oxide fill.

6. A method for formation of a sealed shallow trench isolation (STI) region for a semiconductor device, the method comprising:
    forming a STI region in a substrate, the STI region comprising a STI fill;
    forming a sealing recess in the STI fill of the STI region;
    forming a sealing layer in the sealing recess over the STI fill, wherein the sealing layer comprises silicon nitride (SiN);
    forming an oxide fill over the sealing layer;
    planarizing a top surface of the oxide fill such that the top surface of the oxide fill is level with a top surface of a pad nitride layer, wherein the pad nitride layer is located on top of a pad oxide layer, the pad oxide layer being located on a top surface of the substrate, wherein a portion of the sealing layer is formed on top of the pad nitride layer, and wherein planarizing the top surface of the oxide fill removes the portion of the sealing layer that is located on top of the pad nitride layer; and
    after planarizing the top surface of the oxide fill, removing a wing portion of the sealing layer, the wing portion of the sealing layer being located between the oxide fill and the pad nitride layer, simultaneously with removal of the pad nitride layer.

7. The method of claim 6, further comprising performing an amorphization implant of the wing portion of the sealing layer before removal of the wing portion of the sealing layer, the amorphization implant having an amorphization depth that reaches to a level of about a top surface of the substrate.

8. The method of claim 7, further comprising removing the pad oxide layer and the oxide fill after simultaneously removing the wing portion of the sealing layer and the pad nitride layer.

9. The method of claim 8, further comprising annealing the sealing layer such that the sealing layer is crystallized by the anneal before removing the pad oxide layer and the oxide fill.

10. A semiconductor device comprising:
    an STI region located in a substrate, the STI region comprising a STI fill;
    a sealing layer located directly on top of the STI fill; and
    an oxide fill located directly on top of the sealing layer, wherein a top surface of the oxide fill is level with a top surface of a pad nitride layer, wherein the pad nitride layer is located directly on top of a pad oxide layer, the pad oxide layer being located on a top surface of the substrate;
    wherein the sealing layer comprises a wing portion of the sealing layer located between the oxide fill and the pad nitride layer.

11. The semiconductor device of claim 10, wherein the STI region is located in the substrate, and wherein a top surface of the sealing layer is coplanar with a top surface of the substrate.

12. The semiconductor device of claim 10, wherein the sealing layer comprises silicon nitride (SiN) or a high-k (HK) material.

13. The semiconductor device of claim 10, wherein the STI region further comprises a sealing liner, the sealing liner comprising the same material as the sealing layer, the sealing liner being located between the substrate and the STI fill in the STI region.

* * * * *